United States Patent
Jin

(10) Patent No.: US 10,210,787 B2
(45) Date of Patent: Feb. 19, 2019

(54) DISPLAY PANEL AND DISPLAY DEVICE

(71) Applicants: SHANGHAI AVIC OPTO ELECTRONICS CO., LTD, Shanghai (CN); TIANMA MICRO-ELECTRONICS CO., LTD., Shenzhen (CN)

(72) Inventor: Huijun Jin, Shanghai (CN)

(73) Assignees: SHANGHAI AVIC OPTO ELECTRONICS CO., LTD, Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 2 days.

(21) Appl. No.: 15/299,480

(22) Filed: Oct. 21, 2016

(65) Prior Publication Data
US 2017/0039924 A1 Feb. 9, 2017

(30) Foreign Application Priority Data
Jun. 30, 2016 (CN) .......................... 2016 1 0511252

(51) Int. Cl.
G09G 3/20 (2006.01)
H01L 27/32 (2006.01)
G09G 3/3208 (2016.01)
G09G 3/36 (2006.01)

(52) U.S. Cl.
CPC ....... *G09G 3/2003* (2013.01); *H01L 27/3213* (2013.01); *H01L 27/3218* (2013.01); *G09G 3/3208* (2013.01); *G09G 3/3607* (2013.01); *G09G 2300/0452* (2013.01)

(58) Field of Classification Search
CPC ......... G09G 2300/0452; G09G 3/3607; G09G 2300/0443; G09G 2300/0439
See application file for complete search history.

(56) References Cited

U.S. PATENT DOCUMENTS

| 2003/0128225 A1 | 7/2003 | Credelle et al. |
| 2005/0225574 A1 | 10/2005 | Brown Elliott et al. |
| 2007/0159492 A1* | 7/2007 | Lo .......................... G09G 5/026 345/589 |

(Continued)

FOREIGN PATENT DOCUMENTS

| CN | 102636894 A | 8/2012 |
| CN | 1722193 B | 4/2013 |

(Continued)

*Primary Examiner* — Koosha Sharifi-Tafreshi
(74) *Attorney, Agent, or Firm* — Kilpatrick Townsend & Stockton LLP

(57) ABSTRACT

A display panel and a display device are provided. The display panel includes a first substrate, a second substrate, and a pixel unit array. The pixel unit array includes multiple pixel units, the pixel unit includes three sub-pixels, the sub-pixel is a first color sub-pixel, a second color sub-pixel, a third color sub-pixel or a fourth color sub-pixel. In any two pixel units adjacent to each other, one of the sub-pixels in one of the two pixel units is different in color from one of the sub-pixels in the other one of the two pixel units, and the other two of the sub-pixels in the one of the two pixel units are the same in color as the other two of the sub-pixels in the other one of the two pixel units respectively.

14 Claims, 6 Drawing Sheets

(56) References Cited

U.S. PATENT DOCUMENTS

| | | | | |
|---|---|---|---|---|
| 2008/0049047 A1* | 2/2008 | Credelle | ............. | G09G 3/2003 |
| | | | | 345/690 |
| 2008/0231577 A1* | 9/2008 | Lin | ...................... | G09G 3/3607 |
| | | | | 345/90 |
| 2010/0118045 A1 | 5/2010 | Brown Elliott et al. | | |
| 2011/0156992 A1* | 6/2011 | Moon | ................... | G09G 3/3607 |
| | | | | 345/84 |
| 2012/0206512 A1* | 8/2012 | Kim | ................... | G02F 1/133514 |
| | | | | 345/691 |
| 2016/0117969 A1* | 4/2016 | Qin | ...................... | G09G 3/2003 |
| | | | | 345/694 |
| 2017/0110086 A1* | 4/2017 | Guo | ......................... | G09G 5/02 |

FOREIGN PATENT DOCUMENTS

| | | |
|---|---|---|
| CN | 103185996 A | 7/2013 |
| CN | 103280178 A | 9/2013 |
| CN | 104505041 A | 4/2015 |
| CN | 104658433 A | 5/2015 |

\* cited by examiner

DISPLAY PANEL AND DISPLAY DEVICE

CROSS REFERENCE OF RELATED APPLICATION

The present application claims the priority to Chinese Patent Application No. 201610511252.X, titled "DISPLAY PANEL AND DISPLAY DEVICE", filed on Jun. 30, 2016 with the State Intellectual Property Office of the PRC, which is incorporated herein by reference in its entirety.

FIELD

The disclosure relates to the technical field of display, and in particular to a display panel and a display device.

BACKGROUND

An array substrate of a conventional RGBW display panel includes a RGBW pixel array. The RGBW pixel array includes multiple pixel units arranged in an array. Each of the pixel units includes four sub-pixels. The four sub-pixels are a red sub-pixel R, a green sub-pixel G, a blue sub-pixel B and a white sub-pixel W respectively. A length in a row direction of any one of the sub-pixels equals to ½ of a length in a column direction of the sub-pixel.

Comparing with a conventional RGB display panel, the RGBW display panel improves transmittance of the display panel by adding a white sub-pixel W. But for the display panels having the same sub-pixel size and the same panel area, an area of the pixel unit including four sub-pixels is large, which causes a low resolution of the display panel, thereby causing a phenomenon of a less sharpness of a display screen and a fuzzy screen.

SUMMARY

In view of this, a display panel and a display device are provided in the disclosure to solve the problem of a low resolution of the display panel in conventional technology.

In order to achieve the above object, the following technical solutions are provided in the disclosure.

A display panel is provided, which includes a first substrate and a second substrate arranged opposite to each other, and a pixel unit array located on a side of the first substrate facing towards the second substrate. The pixel unit array includes multiple pixel units arranged in an array. Each of the pixel units includes three sub-pixels arranged in a row direction in sequence. Each of the sub-pixels may be a first color sub-pixel, a second color sub-pixel, a third color sub-pixel or a fourth color sub-pixel. In any two of the pixel units adjacent to each other, one of the sub-pixels in one of the two pixel units is different in color from one of the sub-pixels in the other one of the two pixel units, and the other two of the sub-pixels in the one of the two pixel units are the same in color as the other two of the sub-pixels in the other one of the two pixel units respectively.

A display device including the display panel described above is provided according to the disclosure.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained based on these drawings without any creative work.

DETAILED DESCRIPTION OF EMBODIMENTS

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments in the present disclosure without any creative work fall into the protection scope of the present disclosure.

Figure 1:
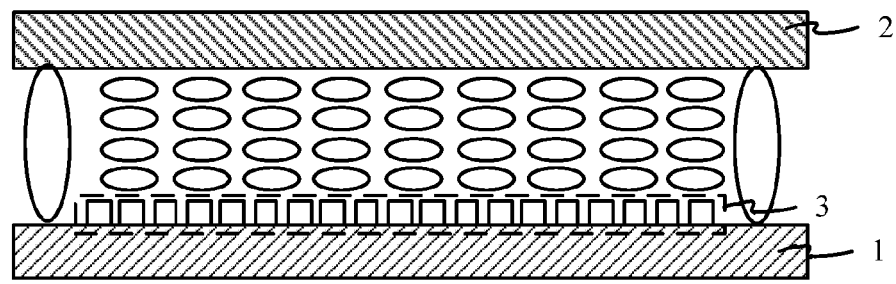
FIG. 1 is a schematic profile structural diagram of a display panel according to an embodiment of the present disclosure.

A display panel is provided according to an embodiment of the disclosure. As shown in FIG. 1, FIG. 1 is a schematic profile structural diagram of the display panel according to the embodiment. The display panel includes a first substrate 1 and a second substrate 2 arranged opposite to each other, and a pixel unit array 3 located on a side of the first substrate 1 facing towards the second substrate 2. Specifically, the first substrate 1 is an array substrate, and the second substrate 2 is a color film substrate. And in a case that the display panel of the embodiment is a liquid crystal display panel, there is a liquid crystal layer between the first substrate 1 and the second substrate 2, which is not described here.

Figure 2:
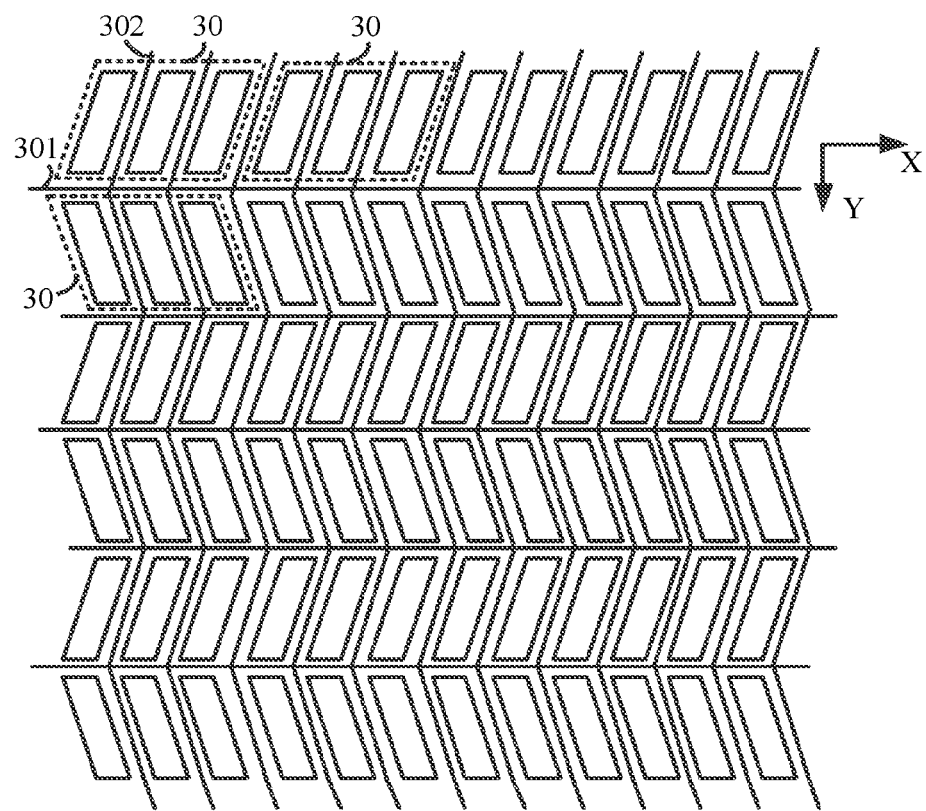
FIG. 2 is a schematic top view structural diagram of a display panel according to an embodiment of the present disclosure.

As shown in FIG. 2, FIG. 2 is a schematic top view structural diagram of the display panel according to the embodiment. The pixel unit array 3 includes multiple pixel units 30 arranged in an array. That is, multiple pixel units 30 are arranged in multiple rows and multiple columns. Each of the pixel units 30 includes three sub-pixels arranged in a row direction namely an X direction in sequence. Based on this, all of the sub-pixels of the pixel units 30 form a sub-pixel array. There is a gate line 301 in a gap of the sub-pixel array extending along the row direction namely the X direction. There is a data line 302 in a gap of the sub-pixel array extending along a column direction namely a Y direction. Each of the sub-pixels includes a pixel electrode and a thin film transistor. The drain electrode of the thin film transistor is connected to the pixel electrode. The gate electrode of the thin film transistor is connected to the corresponding gate line 301. The source electrode of the thin film transistor is connected to the corresponding data line 302. After the gate line 301 inputs a scanning signal to the gate electrode of the corresponding thin film transistor, the source electrode and the drain electrode of the thin film transistor are controlled to be switched on, to make the date line 302 provide a data signal for driving the sub-pixel to transmit light or emit light to the pixel electrode.

In this embodiment, the sub-pixel includes a first color sub-pixel, a second color sub-pixel, a third color sub-pixel and a fourth color sub-pixel. That is, any one of the sub-pixels of the display panel may be the first color sub-pixel, the second color sub-pixel, the third color sub-pixel or the fourth color sub-pixel.

In any two of the pixel units 30 adjacent to each other, one of the sub-pixels in one of the two pixel units 30 is different in color from one of the sub-pixels in the other one of the two pixel units 30, and the other two of the sub-pixels in the one of the two pixel units 30 are the same in color as the other two of the sub-pixels in the other one of the two pixel units 30 respectively. In a specific embodiment, the three sub-pixels in each pixel unit in a first set of the pixel units 30 are the first color sub-pixel, the second color sub-pixel and the third color sub-pixel respectively; the three sub-pixels in each pixel unit in a second set of the pixel units 30 are the fourth color sub-pixel, the first color sub-pixel and the second color sub-pixel respectively; the three sub-pixels in each pixel unit in a third set of the pixel units 30 are the third color sub-pixel, the fourth color sub-pixel and the first color sub-pixel respectively; and the three sub-pixels in each pixel unit other than the pixel units in the first set, the second set and the third set are the second color sub-pixel, the third color sub-pixel and the fourth color sub-pixel respectively.

The embodiments are described in conjunction with specific colors of the sub-pixels hereinafter. In an embodiment, the first color sub-pixel is a red sub-pixel R, the second color sub-pixel is a green sub-pixel G, the third color sub-pixel is a blue sub-pixel B, and the fourth color sub-pixel is a white sub-pixel W. In this case, the three sub-pixels in each pixel unit in the first set of the pixel units 30 are the red sub-pixel R, the green sub-pixel G and the blue sub-pixel B respectively; the three sub-pixels in each pixel unit in the second set of the pixel units 30 are the white sub-pixel W, the red sub-pixel R and the green sub-pixel G respectively; the three sub-pixels in each pixel unit in the third set of the pixel units 30 are the blue sub-pixel B, the white sub-pixel W and the red sub-pixel R respectively; and the three sub-pixels in each pixel unit other than the pixel units in the first set, the second set and the third set are the green sub-pixel G, the blue sub-pixel B and the white sub-pixel W respectively.

As can be seen, one of the sub-pixels in a RGB pixel unit is different from one of the sub-pixels in a WRG pixel unit, and the other two of the sub-pixels in the RGB pixel unit are the same as the other two of the sub-pixels in the WRG pixel unit respectively. One of the sub-pixels in the WRG pixel unit is different from one of the sub-pixels in a BWR pixel unit, and the other two of the sub-pixels in the WRG pixel unit are the same as the other two of the sub-pixels in the BWR pixel unit respectively. One of the sub-pixels in the BWR pixel unit is different from one of the sub-pixels in a GBW pixel unit, and the other two of the sub-pixels in the BWR pixel unit are the same as the other two of the sub-pixels in the GBW pixel unit respectively. One of the sub-pixels in the GBW pixel unit is different from one of the sub-pixels in the RGB pixel unit, and the other two of the sub-pixels in the GBW pixel unit are the same as the other two of the sub-pixels in the RGB pixel unit respectively. The other adjacent pixel units are similar to the above pixel units, which are not described here.

It should be noted that, the embodiment is described by taking the first color sub-pixel being the red sub-pixel R, the second color sub-pixel being the green sub-pixel G, the third color sub-pixel being the blue sub-pixel B, the fourth color sub-pixel being the white sub-pixel W as an example, which is not limited here.

In the above embodiment, the arrangement of the pixel units is not specifically limited. The RGB pixel unit and the WRG pixel unit may be arranged in the row direction namely the X direction in sequence. The RGB pixel unit and the BWR pixel unit may also be arranged in the row direction namely the X direction in sequence. However, in order to improve the screen display effect of the display panel, a preferred arrangement of the pixel units is provided according to the embodiment.

Figure 3:
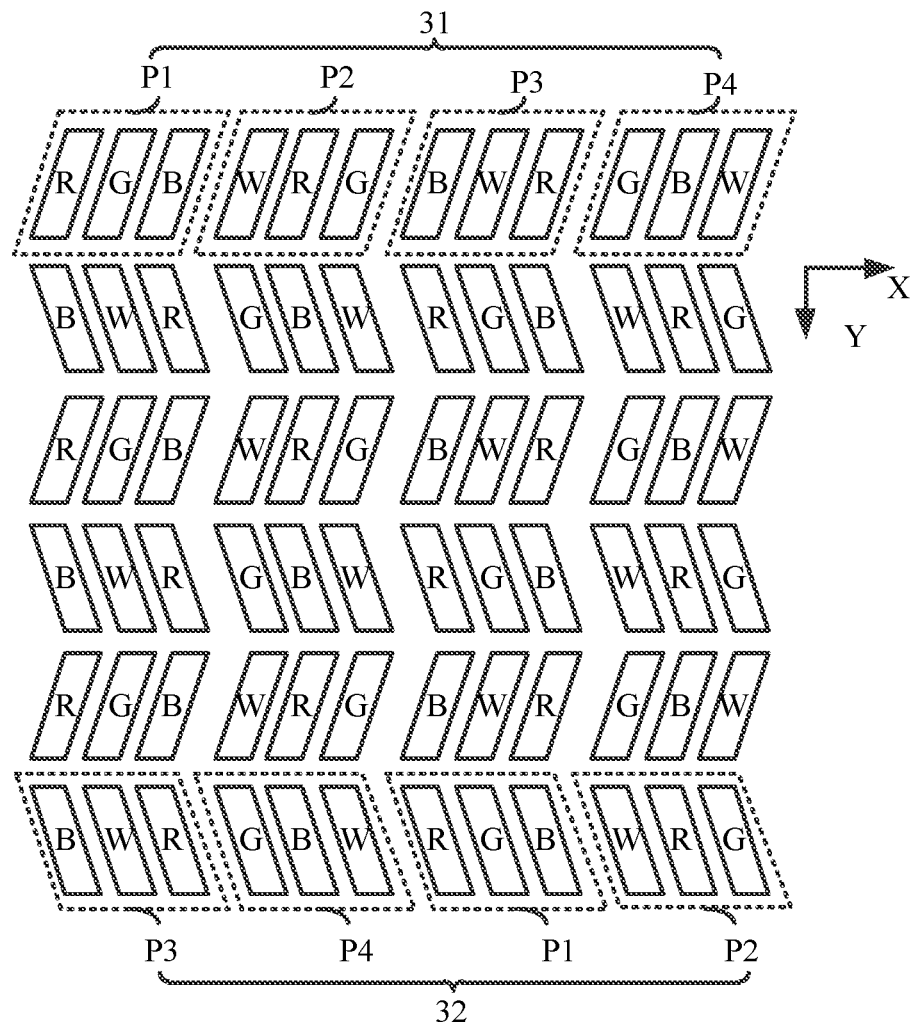
FIG. 3 is a schematic structural diagram of a pixel unit array according to an embodiment of the present disclosure.

As shown in FIG. 3, FIG. 3 is a schematic structural diagram of the pixel unit array according to an embodiment. The pixel unit in the pixel unit array is a first pixel unit P1, a second pixel unit P2, a third pixel unit P3 or a fourth pixel unit P4.

Figure 4:
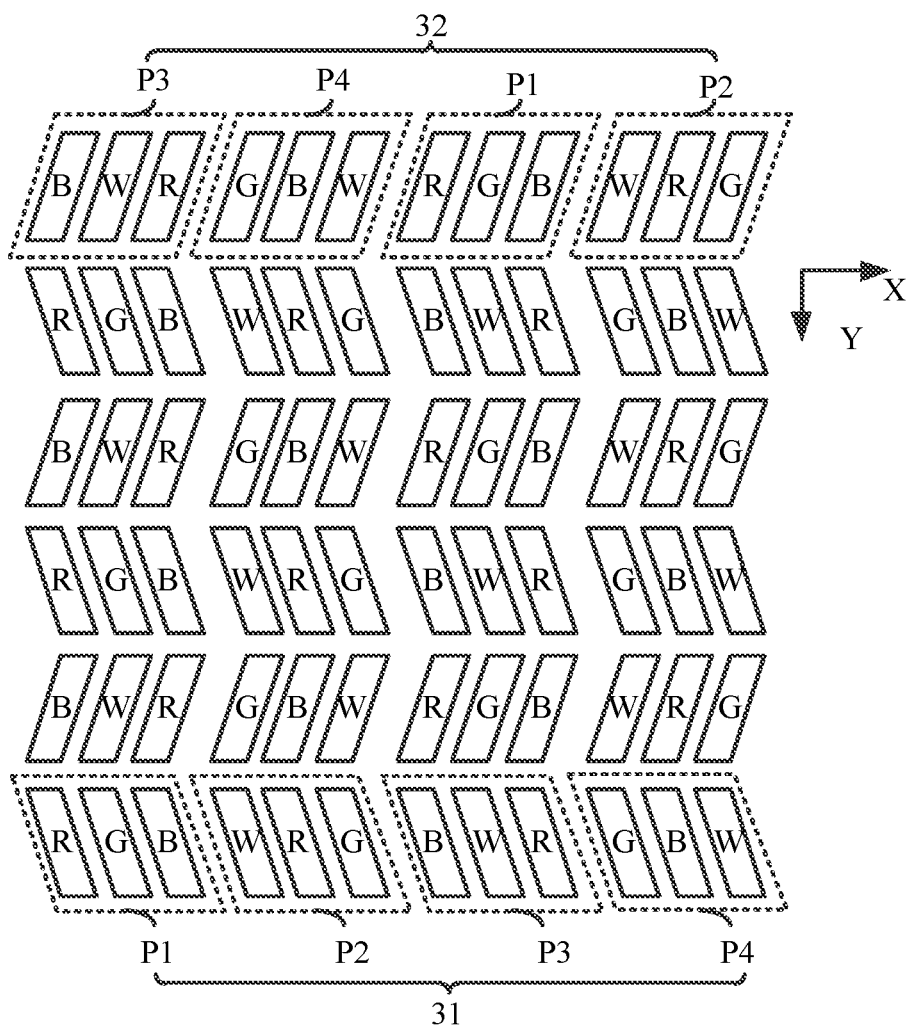
FIG. 4 is another schematic structural diagram of a pixel unit array according to an embodiment of the present disclosure.

An odd row of the pixel unit array includes first pixel groups 31 repeatedly arranged in the row direction namely the X direction, and an even row of the pixel unit array includes second pixel groups 32 repeatedly arranged in the row direction namely the X direction. Of course, the first pixel groups 31 repeatedly arranged in the row direction namely the X direction may be located in the even row of the pixel unit array. The second pixel groups 32 repeatedly arranged in the row direction namely the X direction may be located in the odd row of the pixel unit array. As shown in FIG. 4, FIG. 4 is another schematic structural diagram of the pixel unit array according to an embodiment.

The first pixel group 31 includes the first pixel unit P1, the second pixel unit P2, the third pixel unit P3 and the fourth pixel unit P4 arranged in the row direction namely the X direction in sequence. The second pixel group 32 includes the third pixel unit P3, the fourth pixel unit P4, the first pixel unit P1 and the second pixel unit P2 arranged in the row direction namely the X direction in sequence.

The first pixel unit P1 includes the first color sub-pixel R, the second color sub-pixel G, and the third color sub-pixel B arranged in the row direction namely the X direction in sequence. The second pixel unit P2 includes the fourth color sub-pixel W, the first color sub-pixel R, and the second color sub-pixel G arranged in the row direction namely the X direction in sequence. The third pixel unit P3 includes the third color sub-pixel B, the fourth color sub-pixel W, and the first color sub-pixel R arranged in the row direction namely the X direction in sequence. The fourth pixel unit P4 includes the second color sub-pixel G, the third color sub-pixel B, and the fourth color sub-pixel W arranged in the row direction namely the X direction in sequence.

In the structure shown in FIG. 3 or FIG. 4, adjacent two sub-pixels in the column direction namely the Y direction form a pseudo dual-domain pixel structure. That is, the shape of each of the sub-pixels is a parallelogram, any one of the sub-pixels in an odd row has an opposite incline direction in the row direction namely the X direction to the sub-pixel in an even row adjacent to the odd row and in a same column with the sub-pixel in the odd row. For example, the first sub-pixel in the first row inclines to the right, the first sub-pixel in the second row inclines to the left.

Furthermore, the sub-pixels in different odd rows have a same incline direction in the row direction namely the X direction, and the sub-pixels in different even rows have a same incline direction in the row direction namely the X direction. The sub-pixels in different odd rows have a same incline angle in the row direction, and the sub-pixels in different even rows have a same incline angle in the row direction.

As shown in FIG. 3 or FIG. 4, all of the sub-pixels in the odd rows incline to the right, and all of the sub-pixels in the even rows incline to the left. The incline angles to the right of all of the sub-pixels in the odd rows are the same, and the incline angles to the left of all of the sub-pixels in the even rows are the same. Of course, the disclosure is not limited here. In other embodiments, all of the sub-pixels in the odd rows may incline to the left, and all of the sub-pixels in the even rows may incline to the right.

Compared with a conventional display panel with a single domain pixel structure, the display panel with the pseudo dual-domain pixel structure in the embodiment has less color shift. Compared with a conventional display panel with a true dual-domain pixel structure, the display panel with the pseudo dual-domain pixel structure in the embodiment has a higher aperture ratio.

When the display panel in the embodiment operates, after receiving original image data to be displayed which is inputted from the outside, a controller makes the pixel units of the display panel and pixel points of the original image in one-to-one correspondence based on the arrangement of the pixel units and then obtains the image data of any one of the pixel points. The image data of the pixel point includes a red luminance value, a green luminance value and a blue luminance value of the pixel point. In a case that the pixel unit corresponding to the pixel point does not include the white sub-pixel, for example the first pixel unit P1, a driving signal for driving the corresponding sub-pixel such as the red sub-pixel, the green sub-pixel and the blue sub-pixel in the corresponding pixel unit is generated based on the red luminance value, the green luminance value and the blue luminance value of the pixel point. In a case that the pixel unit corresponding to the pixel point includes the white sub-pixel W, for example the second pixel unit P2, the luminance value of each of the sub-pixels such as the white sub-pixel, the red sub-pixel and the blue sub-pixel in the corresponding pixel unit is calculated based on the red luminance value, the green luminance value and the blue luminance value of the pixel point. The driving signal for driving the corresponding sub-pixel is generated based on the calculated luminance value of each of the sub-pixels.

Based on the above description, the four sub-pixels arranged in the shape of a rectangular array may be light-mixed in a virtual pixel region based on a specific algorithm. That is, the color of a virtual pixel is generated by mixing the red sub-pixel, green sub-pixel, blue sub-pixel and white sub-pixel which are adjacent. Based on this, a virtual pixel array may be formed by different sub-pixels arranged in the shape of a rectangular array. The virtual pixel array includes multiple red virtual pixels, multiple green virtual pixels and multiple blue virtual pixels, where one red virtual pixel, one green virtual pixel and one blue virtual pixel may form one virtual pixel point.

Figure 5:
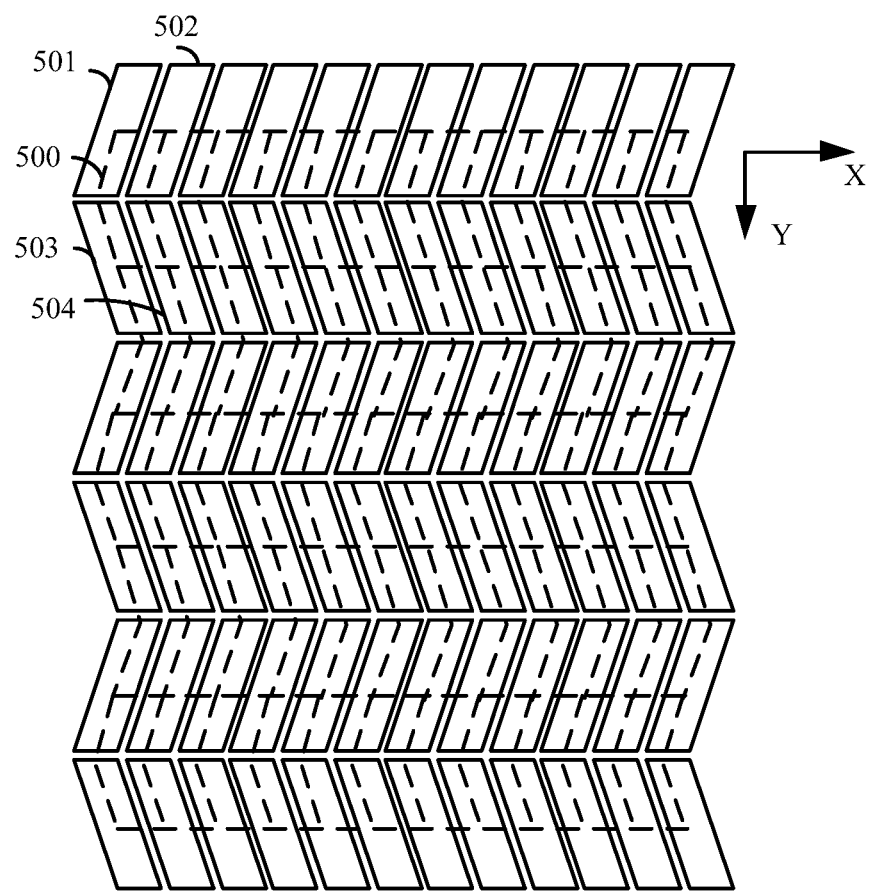
FIG. 5 is a schematic structural diagram of virtual pixels of a display panel according to an embodiment of the present disclosure.

In the embodiment, based on the pseudo dual-domain pixel structure shown in FIG. 3 or FIG. 4, the virtual pixels displayed on the display panel of the embodiment of the disclosure are dual-domain virtual pixels shown in FIG. 5. FIG. 5 is a schematic structural diagram of virtual pixels of the display panel according to an embodiment of the present disclosure. A center of the dual-domain virtual pixel is a crossing point of the adjacent four sub-pixels and the dual-domain virtual pixel covers ¼ of the area of each of the four sub-pixels. The four sub-pixels include adjacent two rows of the sub-pixels arranged in the column direction. Each row of the adjacent two rows of the sub-pixels includes two sub-pixels arranged in the row direction.

As shown in FIG. 5, the four sub-pixels are sub-pixels 501, 502, 503 and 504 respectively. The adjacent sub-pixels 501 and 502 are located in the same row. The adjacent sub-pixels 503 and 504 are located in the same row. The adjacent sub-pixels 501 and 503 are located in the same column. The adjacent sub-pixels 502 and 504 are located in the same column. The dual-domain virtual pixel 500 covers ¼ of the area of the sub-pixel 501. The dual-domain virtual pixel 500 covers ¼ of the area of the sub-pixel 502. The dual-domain virtual pixel 500 covers ¼ of the area of the sub-pixel 503. The dual-domain virtual pixel 500 covers ¼ of the area of the sub-pixel 504.

Figure 6:
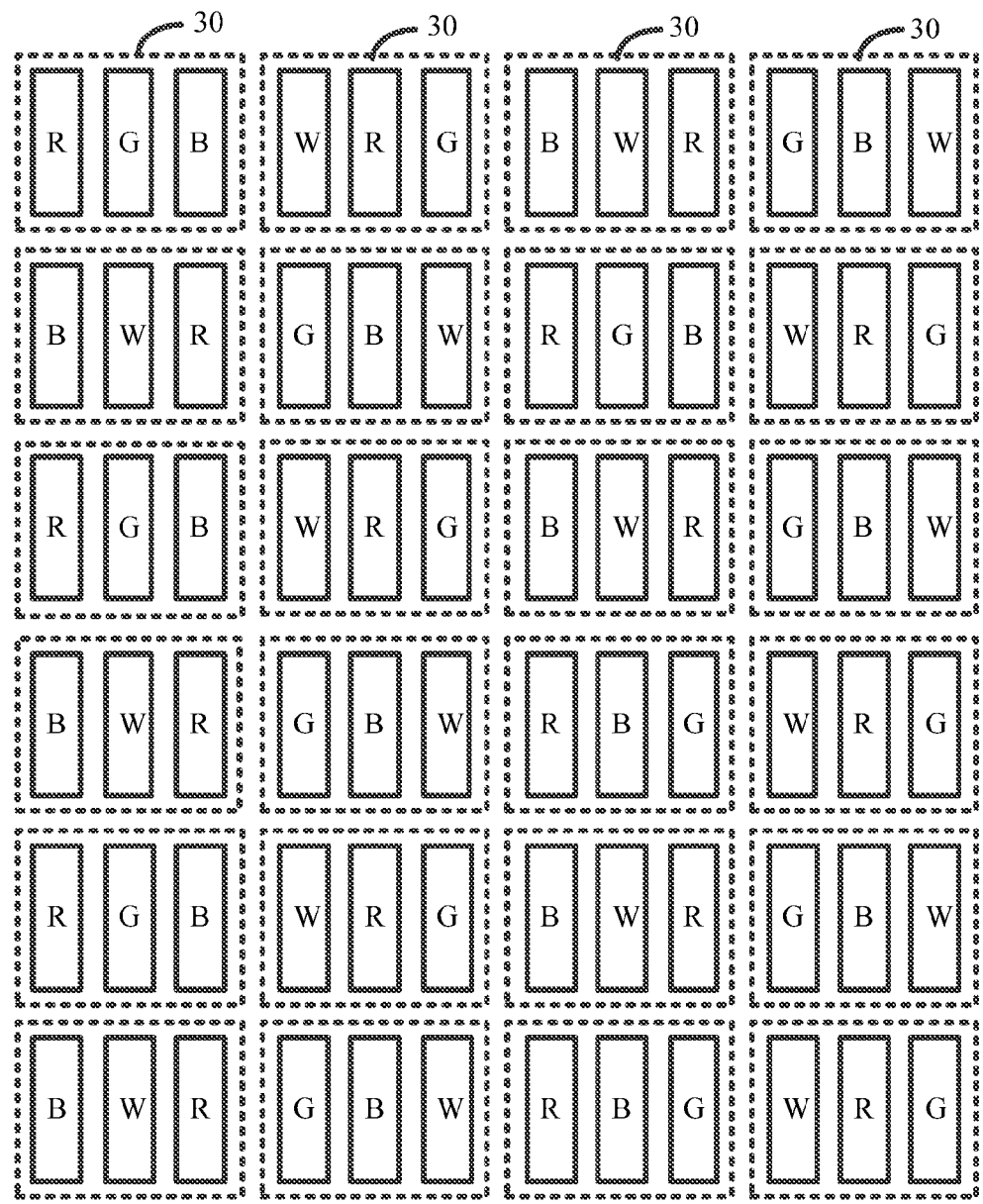
FIG. 6 is another schematic structural diagram of sub-pixels according to an embodiment of the present disclosure.

It should be noted that, the shape of the sub-pixel in the disclosure may be not only a parallelogram but also a rectangle showed in FIG. 6. FIG. 6 is another schematic structural diagram of sub-pixels according to an embodiment of the present disclosure. The arrangement of the sub-pixels in FIG. 6 is the same as the arrangement of the sub-pixels in FIG. 5, which is not described here.

Based on any one of above embodiments, a length of any one of the sub-pixels in the row direction namely the X direction equals to ⅓ of a length of the sub-pixel in the column direction namely the Y direction in the embodiment. Compared with the conventional sub-pixel of which the length in the row direction namely the X direction is ½ of the length in the column direction namely the Y direction, the area of the sub-pixel in the embodiment is smaller, the resolution of the display panel in the embodiment is higher.

It should be noted that, in a case that the display panel in the embodiment is a liquid crystal display panel, the color of the sub-pixel depends on the color of a color resistance on a side of a second substrate 21 facing towards a first substrate 20. Optionally, the color resistance is an optical filter through which light of a specific color can pass. Particularly, there is a color resistance array on the side of the second substrate 21 facing towards the first substrate 20. The color resistance array includes multiple color resistances. The color resistances are arranged in a one to one correspondence with the sub-pixels. The color resistances include color resistances having four colors, i.e., the red color resistance, the green color resistance, the blue color resistance and the white color resistance. Based on this, the sub-pixel corresponding to the red color resistance is the red sub-pixel, the sub-pixel corresponding to the green color resistance is the green sub-pixel, the sub-pixel corresponding to the blue color resistance is the blue sub-pixel, and the sub-pixel corresponding to the white color resistance is the white sub-pixel.

In a case that the display panel in this embodiment is an LED (Light Emitting Diode) or an OLED (Organic Light-Emitting Diode) display panel, the color of the sub-pixel depends on the color of a luminescent layer or an organic luminescent layer on a surface of a pixel electrode of the sub-pixel. Particularly, in a case that the color of the light emitted by the luminescent layer or the organic luminescent layer is red, the corresponding sub-pixel is the red sub-pixel; in a case that the color of the light emitted by the luminescent layer or the organic luminescent layer is green, the corresponding sub-pixel is the green sub-pixel; in a case that the color of the light emitted by the luminescent layer or the organic luminescent layer is blue, the corresponding sub-pixel is the blue sub-pixel; and in a case that the color of the light emitted by the luminescent layer or the organic luminescent layer is white, the corresponding sub-pixel is the white sub-pixel.

In the display panel according to this embodiment, each of the pixel units includes three sub-pixels arranged in the row direction in sequence. Each of the sub-pixels is the first color sub-pixel, the second color sub-pixel, the third color sub-pixel or the fourth color sub-pixel. In any two of the pixel units adjacent to each other, one of the sub-pixels in one of the two pixel units is different in color from one of the sub-pixels in the other one of the two pixel units, and the other two of the sub-pixels in the one of the two pixel units are the same in color as the other two of the sub-pixels in the other one of the two pixel units respectively. For example, the sub-pixels in adjacent two pixel units are RGB and WRG respectively, or WRG and BWR respectively, or BWR and GBW respectively. Based on this, in the display panel according to the embodiment of the disclosure, transmittance is improved by adding a color sub-pixel such as a white sub-pixel W. Compared with the conventional RGBW display panel, the pixel unit in accordance with the disclosure includes only three sub-pixels, an area of the pixel unit is small, in this way, resolution of the display panel is improved and a phenomenon of a less sharpness of a display screen and a fuzzy screen is avoided.

Figure 7:
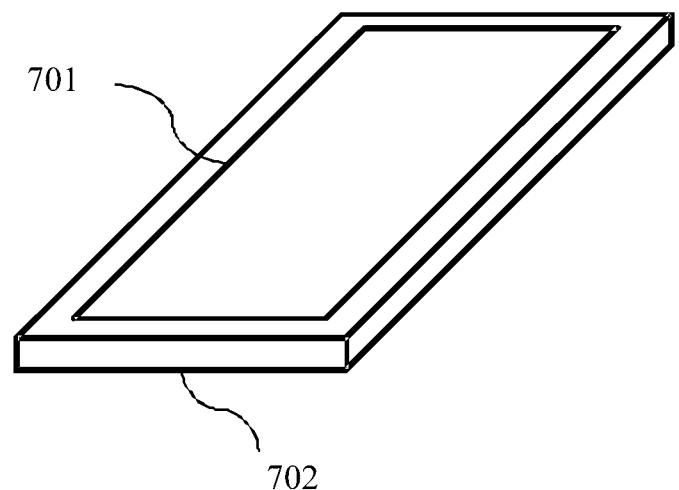
FIG. 7 is a schematic structural diagram of a display device including a display panel according to an embodiment of the present disclosure.

A display device is further provided by some embodiments. The display device includes any one of the display panels according to the above embodiments. As shown in FIG. 7, FIG. 7 is a schematic structural diagram of a display device including a display panel according to an embodiment of the present disclosure. The display device 702 includes the display panel 701 being any one of the display panels described above. The resolution of the display device is high, so it is not easy to cause the phenomenon of a less sharpness of a display screen and a fuzzy screen.

Various embodiments of the specification are described in a progressive way, and each embodiment lays emphasis on differences from other embodiments. For the same or similar parts among various embodiments, one may refer to the description of other embodiments. According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. A display panel comprising:
   a first substrate and a second substrate arranged opposite to each other; and
   a pixel unit array located on a side of the first substrate facing towards the second substrate, wherein the pixel unit array comprises a plurality of pixel units arranged in an array to form a dual-domain virtual pixels, each of the pixel units comprises three sub-pixels arranged in a row direction in sequence, and each of the sub-pixels is a first color sub-pixel, a second color sub-pixel, a third color sub-pixel or a fourth color sub-pixel; wherein
   in any two of the pixel units adjacent to each other, one of the sub-pixels in one of the two pixel units is different in color from one of the sub-pixels in the other one of the two pixel units, and the other two of the sub-pixels in the one of the two pixel units are the same in color as the other two of the sub-pixels in the other one of the two pixel units respectively,
   wherein a shape of the sub-pixel is a parallelogram; and
   any one of the sub-pixels in an odd row has an opposite incline direction in the row direction to the sub-pixel in an even row adjacent to the odd row and in a same column with the sub-pixel in the odd row,
   wherein the sub-pixels in different odd rows have a same incline angle in the row direction; and
   the sub-pixels in different even rows have a same incline angle in the row direction,
   wherein, the colors of all of the sub-pixels in each odd row are in an order of the first color, the second color, the third color and the fourth color, and the colors of all of the sub-pixels in each even row are in an order of the third color, the fourth color, the first color, and the second color,
   wherein, a center of the dual-domain virtual pixel is a crossing point of the adjacent four sub-pixels and the dual-domain virtual pixel covers ¼ of the area of each of the four sub-pixels, wherein, the four sub-pixels include adjacent two rows of the sub-pixels arranged in the column direction, wherein, each row of the adjacent two rows of the sub-pixels includes two sub-pixels arranged in the row direction.

2. The display panel according to claim 1, wherein the three sub-pixels in each pixel unit in a first set of the pixel units are the first color sub-pixel, the second color sub-pixel and the third color sub-pixel respectively;
   the three sub-pixels in each pixel unit in a second set of the pixel units are the fourth color sub-pixel, the first color sub-pixel and the second color sub-pixel respectively;
   the three sub-pixels in each pixel unit in a third set of the pixel units are the third color sub-pixel, the fourth color sub-pixel and the first color sub-pixel respectively; and
   the three sub-pixels in each pixel unit other than the pixel units in the first set, the second set and the third set are the second color sub-pixel, the third color sub-pixel and the fourth color sub-pixel respectively.

3. The display panel according to claim 2, wherein the pixel units comprise a first pixel unit, a second pixel unit, a third pixel unit and a fourth pixel unit; and, wherein
   an odd row of the pixel unit array comprises first pixel groups repeatedly arranged in the row direction, and an even row of the pixel unit array comprises second pixel groups repeatedly arranged in the row direction; or an even row of the pixel unit array comprises first pixel groups repeatedly arranged in the row direction, and an odd row of the pixel unit array comprises second pixel groups repeatedly arranged in the row direction;
   each of the first pixel groups comprises the first pixel unit, the second pixel unit, the third pixel unit and the fourth pixel unit arranged in the row direction in sequence, and each of the second pixel groups comprises the third pixel unit, the fourth pixel unit, the first pixel unit and the second pixel unit arranged in the row direction in sequence; and
   the first pixel unit comprises the first color sub-pixel, the second color sub-pixel, and the third color sub-pixel arranged in the row direction in sequence; the second pixel unit comprises the fourth color sub-pixel, the first color sub-pixel, and the second color sub-pixel arranged in the row direction in sequence; the third pixel unit comprises the third color sub-pixel, the fourth color sub-pixel, and the first color sub-pixel arranged in the row direction in sequence; and the fourth pixel unit comprises the second color sub-pixel, the third color sub-pixel, and the fourth color sub-pixel arranged in the row direction in sequence.

4. The display panel according to claim 3, wherein the first color sub-pixel is a red sub-pixel, the second color sub-pixel is a green sub-pixel, the third color sub-pixel is a blue sub-pixel and the fourth color sub-pixel is a white sub-pixel.

5. The display panel according to claim 1, wherein a length of any one of the sub-pixels in the row direction equals to ⅓ of a length of the sub-pixel in a column direction.

6. The display panel according to claim 1, wherein the sub-pixels in different odd rows have a same incline direction in the row direction; and
the sub-pixels in different even rows have a same incline direction in the row direction.

7. The display panel according to claim 1, wherein a shape of the sub-pixel is a rectangle.

8. A display device comprising a display panel, wherein the display panel comprises:
a first substrate and a second substrate arranged opposite to each other; and
a pixel unit array located on a side of the first substrate facing towards the second substrate; wherein the pixel unit array comprises a plurality of pixel units arranged in an array to form a dual-domain virtual pixels, each of the pixel units comprises three sub-pixels arranged in a row direction in sequence, each of the sub-pixels is a first color sub-pixel, a second color sub-pixel, a third color sub-pixel or a fourth color sub-pixel, and
in any two of the pixel units adjacent to each other, one of the sub-pixels in one of the two pixel units is different in color from one of the sub-pixels in the other one of the two pixel units, and the other two of the sub-pixels in the one of the two pixel units are the same in color as the other two of the sub-pixels in the other one of the two pixel units respectively,
wherein a shape of the sub-pixel is a parallelogram; and
any one of the sub-pixels in an odd row has an opposite incline direction in the row direction to the sub-pixel in an even row adjacent to the odd row and in a same column with the sub-pixel in the odd row,
wherein the sub-pixels in different odd rows have a same incline angle in the row direction; and
the sub-pixels in different even rows have a same incline angle in the row direction,
wherein, the colors of all of the sub-pixels in each odd row are in an order of the first color, the second color, the third color and the fourth color, and the colors of all of the sub-pixels in each even row are in an order of the third color, the fourth color, the first color, and the second color,
wherein, a center of the dual-domain virtual pixel is a crossing point of the adjacent four sub-pixels and the dual-domain virtual pixel covers ¼ of the area of each of the four sub-pixels, wherein, the four sub-pixels include adjacent two rows of the sub-pixels arranged in the column direction, wherein, each row of the adjacent two rows of the sub-pixels includes two sub-pixels arranged in the row direction.

9. The display device according to claim 8, wherein the three sub-pixels in each pixel unit in a first set of the pixel units are the first color sub-pixel, the second color sub-pixel and the third color sub-pixel respectively;
the three sub-pixels in each pixel unit in a second set of the pixel units are the fourth color sub-pixel, the first color sub-pixel and the second color sub-pixel respectively;
the three sub-pixels in each pixel unit in a third set of the pixel units are the third color sub-pixel, the fourth color sub-pixel and the first color sub-pixel respectively; and
the three sub-pixels in each pixel unit other than the pixel units in the first set, the second set and the third set are the second color sub-pixel, the third color sub-pixel and the fourth color sub-pixel respectively.

10. The display device according to claim 9, wherein the pixel units comprise a first pixel unit, a second pixel unit, a third pixel unit and a fourth pixel unit; and, wherein
an odd row of the pixel unit array comprises first pixel groups repeatedly arranged in the row direction, and an even row of the pixel unit array comprises second pixel groups repeatedly arranged in the row direction; or an even row of the pixel unit array comprises first pixel groups repeatedly arranged in the row direction, and an odd row of the pixel unit array comprises second pixel groups repeatedly arranged in the row direction;
each of the first pixel groups comprises the first pixel unit, the second pixel unit, the third pixel unit and the fourth pixel unit arranged in the row direction in sequence, and each of the second pixel groups comprises the third pixel unit, the fourth pixel unit, the first pixel unit and the second pixel unit arranged in the row direction in sequence; and
the first pixel unit comprises the first color sub-pixel, the second color sub-pixel, and the third color sub-pixel arranged in the row direction in sequence; the second pixel unit comprises the fourth color sub-pixel, the first color sub-pixel, and the second color sub-pixel arranged in the row direction in sequence; the third pixel unit comprises the third color sub-pixel, the fourth color sub-pixel, and the first color sub-pixel arranged in the row direction in sequence; and the fourth pixel unit comprises the second color sub-pixel, the third color sub-pixel, and the fourth color sub-pixel arranged in the row direction in sequence.

11. The display device according to claim 10, wherein the first color sub-pixel is a red sub-pixel, the second color sub-pixel is a green sub-pixel, the third color sub-pixel is a blue sub-pixel and the fourth color sub-pixel is a white sub-pixel.

12. The display device according to claim 8, wherein a length of any one of the sub-pixels in the row direction equals to ⅓ of a length of the sub-pixel in a column direction.

13. The display device according to claim 8, wherein the sub-pixels in different odd rows have a same incline direction in the row direction; and
the sub-pixels in different even rows have a same incline direction in the row direction.

14. The display device according to claim 8, wherein a shape of the sub-pixel is a rectangle.

* * * * *